(12) United States Patent
Hattori et al.

(10) Patent No.: US 7,534,109 B2
(45) Date of Patent: May 19, 2009

(54) CONTROL BOARD AND CONTROL APPARATUS

(75) Inventors: Makoto Hattori, Kiyosu (JP); Masahiko Asai, Kiyosu (JP); Koji Toyama, Nagoya (JP); Koji Nakano, Nagoya (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 11/705,414

(22) Filed: Feb. 13, 2007

(65) Prior Publication Data

US 2008/0087458 A1    Apr. 17, 2008

(51) Int. Cl.
*H01R 12/00* (2006.01)
(52) U.S. Cl. .................................................... 439/55
(58) Field of Classification Search .............. 439/55; 363/39, 37, 34, 154; 361/354; 307/79.1, 307/10.1, 105; 257/784; 235/493
See application file for complete search history.

(56) References Cited

U.S. PATENT DOCUMENTS

| | | | | | |
|---|---|---|---|---|---|
| 4,622,526 | A | * | 11/1986 | Schneider et al. | 333/181 |
| 5,910,890 | A | * | 6/1999 | Hansen et al. | 363/41 |
| 6,134,126 | A | * | 10/2000 | Ikekame et al. | 363/39 |
| 6,683,396 | B2 | * | 1/2004 | Ishida et al. | 310/50 |

FOREIGN PATENT DOCUMENTS

JP    2005-036773    2/2005

* cited by examiner

*Primary Examiner*—Alexander Gilman
(74) *Attorney, Agent, or Firm*—Wenderoth, Lind & Ponack, L.L.P.

(57) ABSTRACT

A control board has a pattern for a low-voltage circuit including a ground pattern connectable to a ground and a pattern for a high-voltage circuit including a ground pattern. The patterns for the low-voltage and high-voltage circuits each have one or more ground-connection lands configured to connect the ground patterns thereof to each other via one or more capacitors.

5 Claims, 6 Drawing Sheets

CONTROL BOARD AND CONTROL APPARATUS

BACKGROUND OF THE INVENTION

1. Field of the Invention

The present invention relates to control boards having a pattern for a low-voltage circuit and a pattern for a high-voltage circuit and to control apparatuses including such control boards.

This application is based on Japanese Patent Application No. 2006-280010, the content of which is incorporated herein by reference.

2. Description of Related Art

Conventional car air conditioners operate by converting DC power supplied from a power supply into three-phase AC power with an inverter and supplying the three-phase AC power to a compressor. Recently, electric compressors with integrated inverters have been proposed (for example, see Japanese Unexamined Patent Application, Publication No. 2005-36773).

However, a car air conditioner including such a compressor undesirably causes significant noise because a control apparatus for controlling the compressor is often connected to both a low-voltage system (about 12V system, 24 V system or 36V system) and a high-voltage system (for example about 300 V system).

BRIEF SUMMARY OF THE INVENTION

An object of the present invention is to provide a control board capable of noise reduction for use in a control apparatus connected to both a low-voltage system and a high-voltage system and a control apparatus including such a control board.

The present invention provides: a control board having a pattern for a low-voltage circuit, the pattern for the low-voltage circuit including a ground pattern connectable to a ground; a pattern for a high-voltage circuit, the pattern for the high-voltage circuit including a ground pattern; and at least one ground-connection land configured to connect the ground pattern of the low-voltage circuit and the ground pattern of the high-voltage circuit via at least one capacitor.

In the structure described above, the ground pattern of the low-voltage circuit of the control board can be grounded, so that the low-voltage circuit can operate at a stable frequency. In addition, the ground patterns of the high-voltage and low-voltage circuits can be connected via the capacitors to reduce noise on the high-voltage circuit side. Also, the low-voltage circuit and the high-voltage circuit can be electrically separated because the ground patterns thereof are connected via the capacitors.

The above control board may have one or more grounding lands configured to connect the ground pattern of the high-voltage circuit and the ground via one or more capacitors.

In this case, the ground pattern of the high-voltage circuit can be grounded via the capacitors, so that the high-voltage circuit can operate at a stable frequency.

In the control board described above, a ground-connection land may be disposed so that the capacitors are connected in parallel.

In this case, the ground patterns of the low-voltage and high-voltage circuits can be connected via the capacitors connected in parallel to ensure satisfactory frequency characteristics. In particular, noise covering a wide frequency band can be reduced by connecting capacitors having different frequency characteristics in parallel.

In the control board described above, the ground-connection land may also be disposed so that the capacitors are connected in series.

In this case, the ground patterns of the low-voltage and high-voltage circuits can be connected via the capacitors connected in series to ensure a sufficient withstand voltage.

In the control board described above, the ground-connection lands may be disposed at a plurality of positions, and the capacitors connected thereto may have frequency characteristics corresponding to a frequency band of noise to be reduced.

In this case, the characteristics of the capacitors connected to the ground-connection lands, including capacitance, can be changed according to the frequency band of noise to be reduced. Noise can therefore be reduced effectively in a target frequency band.

The control board according to the present invention is suitable for use in a control apparatus for drive control of a compressor, and more particularly, a control apparatus for a car air conditioner. The use of the control board allows for noise reduction in such a control apparatus.

The above aspects can be combined within the scope of the present invention.

The control board according to the present invention provides the advantage of noise reduction when used in a control apparatus connected to both a low-voltage system and a high-voltage system.

DETAILED DESCRIPTION OF THE INVENTION

A car air conditioner including a control board according to an embodiment of the present invention will now be described with reference to the drawings.

Figure 1:
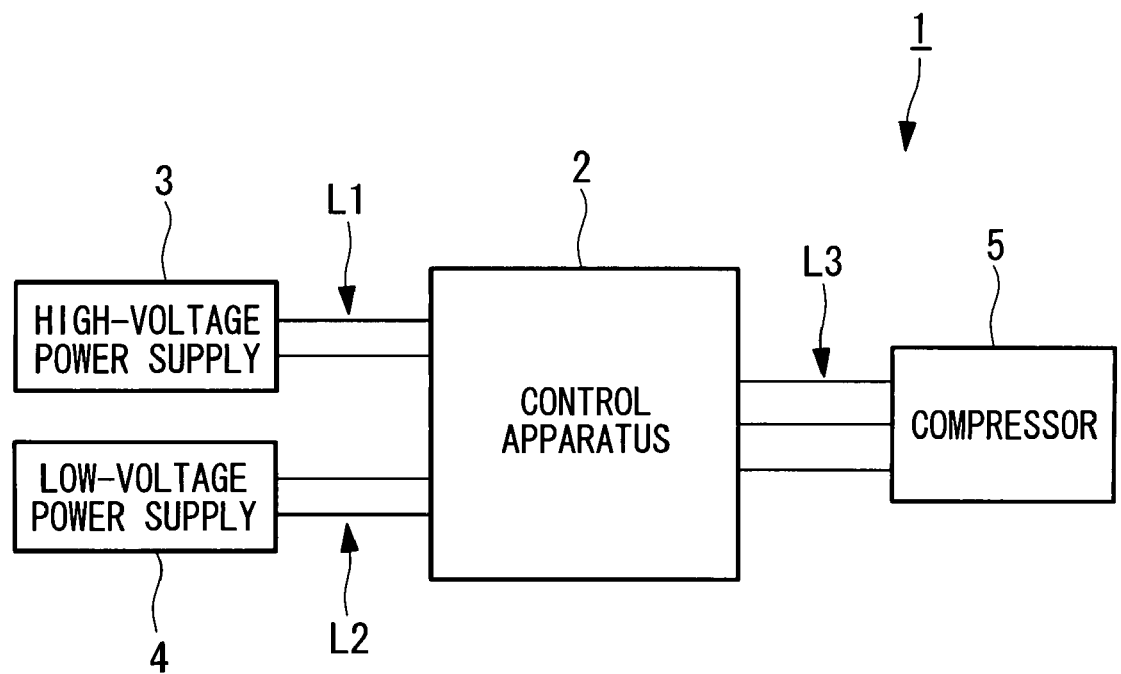
FIG. 1 is a block diagram of a car air conditioner according to an embodiment of the present invention.

FIG. 1 is a block diagram of a car air conditioner 1 according to this embodiment.

In FIG. 1, the input side of a control apparatus 2 is connected to a high-voltage power supply 3 and a low-voltage power supply 4. Specifically, the high-voltage power supply 3 is connected to the control apparatus 2 via high-voltage power lines L1, and the low-voltage power supply 4 is connected to the control apparatus 2 via low-voltage power lines L2. The output side of the control apparatus 2 is connected to a motor of a compressor 5 via three-phase power lines L3.

The level of voltage supplied via the high-voltage power lines L1 is, for example, about 300 V. The level of voltage supplied via the low-voltage power lines L2 is, for example, about 12 V or about 24 V.

In the car air conditioner 1 having the configuration described above, DC power is supplied from the high-voltage power supply 3 to the control apparatus 2 via the power lines L1, is converted into three-phase AC power by an inverter (not shown) in the control apparatus 2, and is supplied to the motor of the compressor 5 via the three-phase power lines L3. Drive control of the inverter, for example, may be based on the known art.

Figure 2:
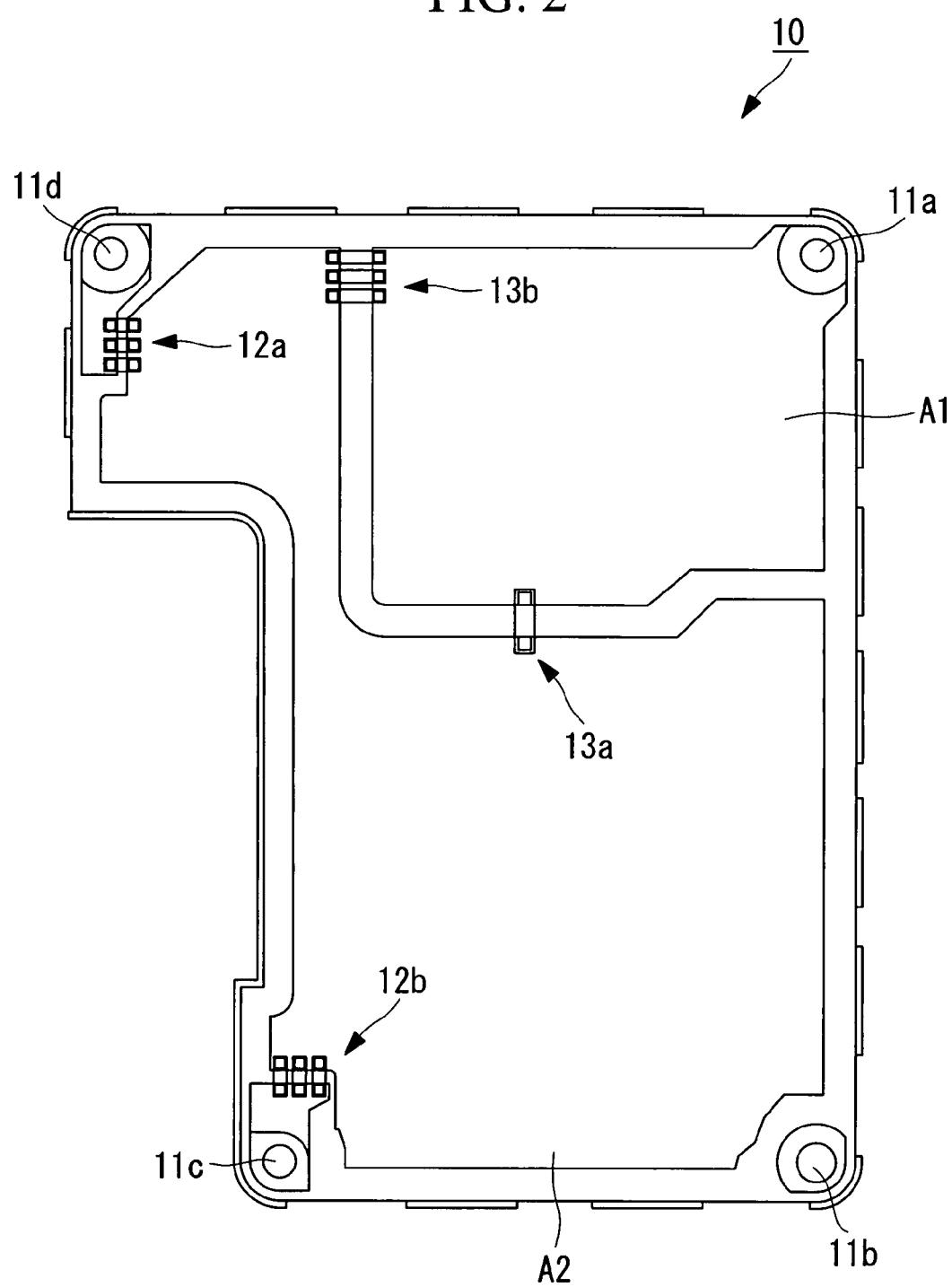
FIG. 2 is a diagram of an example of a control board for use in a control apparatus according to an embodiment of the present invention.

Referring to FIG. 2, the control apparatus 2 of the car air conditioner 1 includes a control board 10 having a low-voltage pattern (a pattern for a low-voltage circuit) configured to control the low voltage supplied via the power lines L2 and a high-voltage pattern (a pattern for a high-voltage circuit) configured to control the high voltage supplied via the power lines L1.

The low-voltage and high-voltage patterns are formed in separate regions. In this embodiment, the low-voltage pattern is formed in a region A1, and the high-voltage pattern is formed in a region A2. Detailed patterns in the regions A1 and A2 are not illustrated.

In the control board 10, the low-voltage circuit includes a ground pattern connectable to a ground. Specifically, the control board 10 has screw holes 11a to 11d for fastening the control board 10 to a casing (not shown), and at least one of them (the screw hole 11a in this embodiment) is connected to the ground pattern of the low-voltage circuit. The control board 10 is fastened to the casing by inserting screws into the screw holes 11a to 11d and fixing them to the casing. The casing is connected to a ground of a car body when installed thereon, so that the ground pattern of the low-voltage circuit can be grounded via the screws and the casing.

The high-voltage circuit includes a ground pattern. The control board 10 has grounding lands 12a and 12b configured to ground the ground pattern of the high-voltage circuit via capacitors. These grounding lands 12a and 12b are used to connect the ground pattern of the high-voltage circuit to the screw holes that are not connected to the ground pattern of the low-voltage circuit, for example, the screw holes 11c and 11d, via the capacitors.

The ground pattern of the high-voltage circuit can thus be grounded via the capacitors by forming the grounding lands 12a and 12b. The capacitors can decrease rapid voltage fluctuations to reduce noise.

The patterns for the low-voltage and high-voltage circuits also have ground-connection lands 13a and 13b configured to connect the ground patterns thereof to each other via capacitors. The number of capacitors connected to the ground-connection lands 13a and 13b and the number of capacitors connected to the grounding lands 12a and 12b in FIG. 2 are merely examples and can be changed according to design specifications.

The grounding lands 12a and 12b and the ground-connection lands 13a and 13b may be arranged so that the capacitors are connected either in parallel or in series. The type of connection of the capacitors can be selected according to factors such as withstand voltage and noise level.

In the example shown in FIG. 2, the grounding lands 12a and 12b and the ground-connection lands 13a and 13b are arranged for parallel connection of the capacitors.

Figure 3:
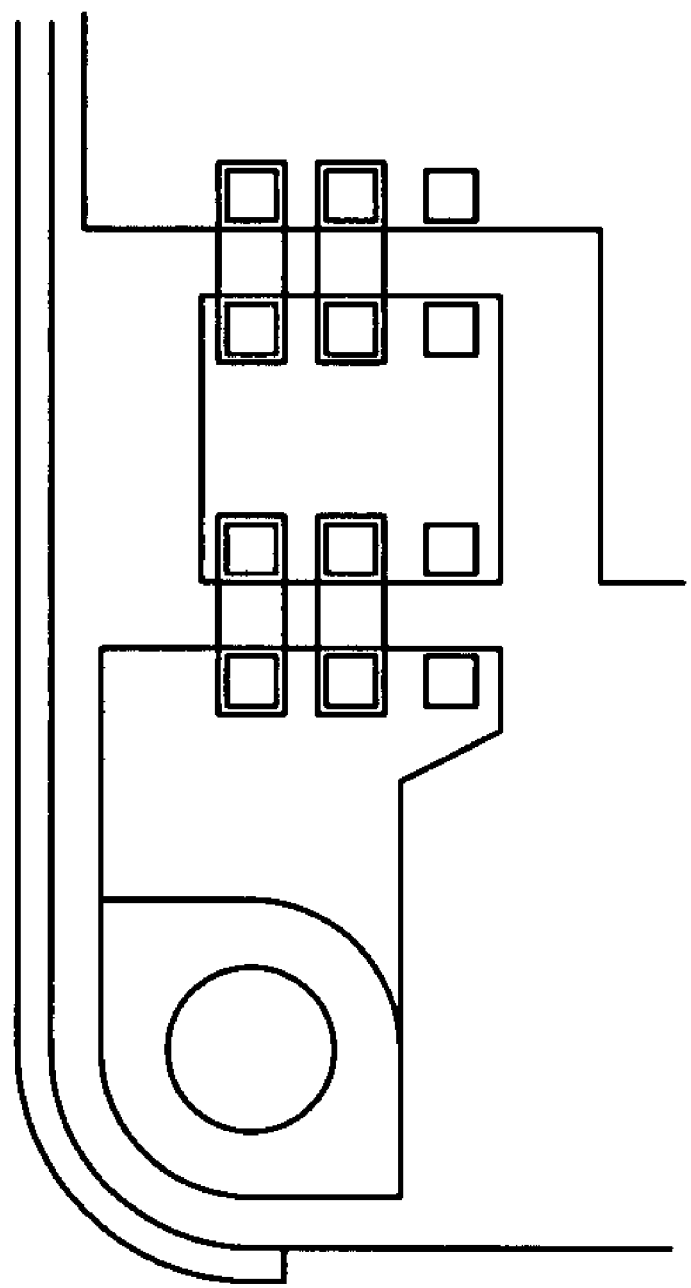
FIG. 3 is a diagram of an example of an arrangement of lands for series connection of capacitors.

FIG. 3 shows an example of an arrangement of lands for series connection of the capacitors. The capacitors may be connected in series using additional lands connected to, for example, the ground patterns of the low-voltage and high-voltage circuits.

The grounding lands 12a and 12b and the ground-connection lands 13a and 13b may be provided at a plurality of positions, depending on the characteristics of the control board 10. The capacitance and number of capacitors connected to the grounding lands 12a and 12b and the ground-connection lands 13a and 13b are preferably selected according to the characteristics of the control board 10 and numerical noise suppression characteristics. Specifically, capacitors having frequency characteristics corresponding to the frequency band of noise to be reduced are preferably connected.

Figure 4:
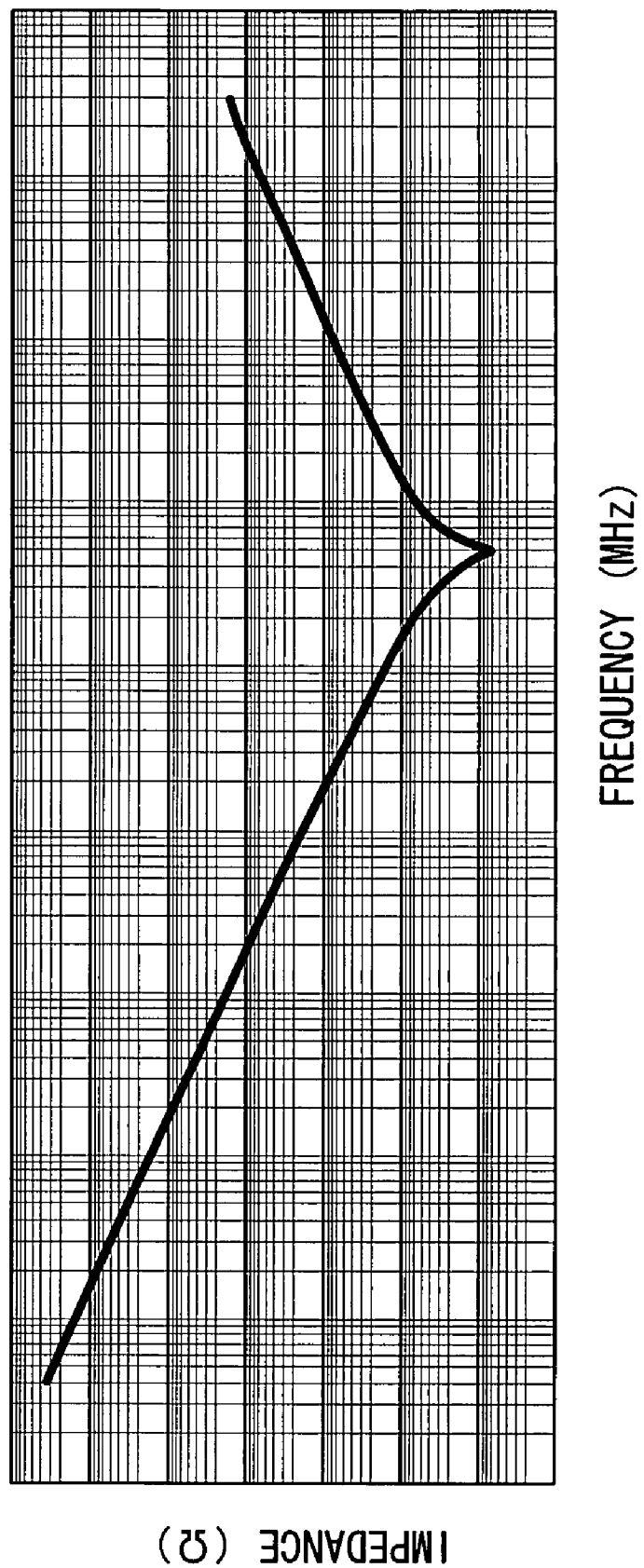
FIG. 4 is a graph showing an example of frequency characteristics of capacitors.
Figure 5:
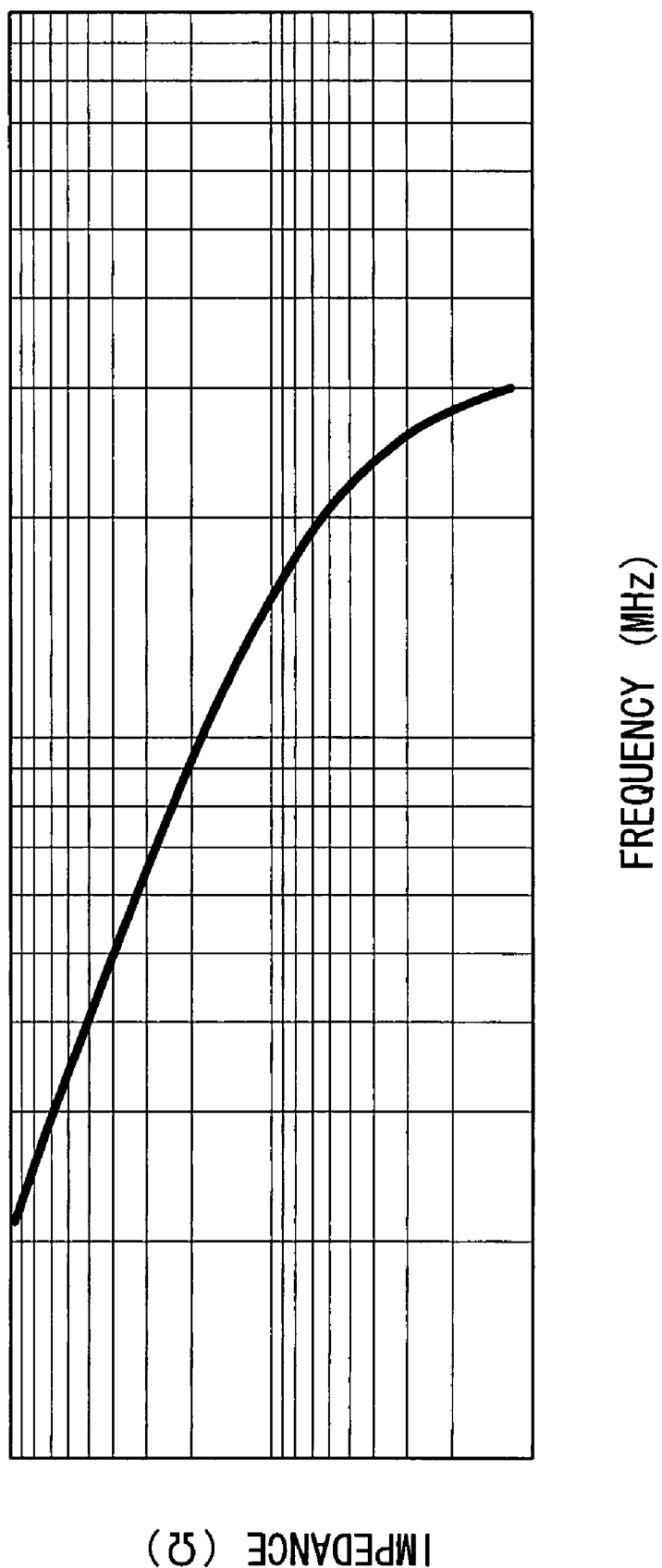
FIG. 5 is a graph showing another example of frequency characteristics of capacitors.
Figure 6:
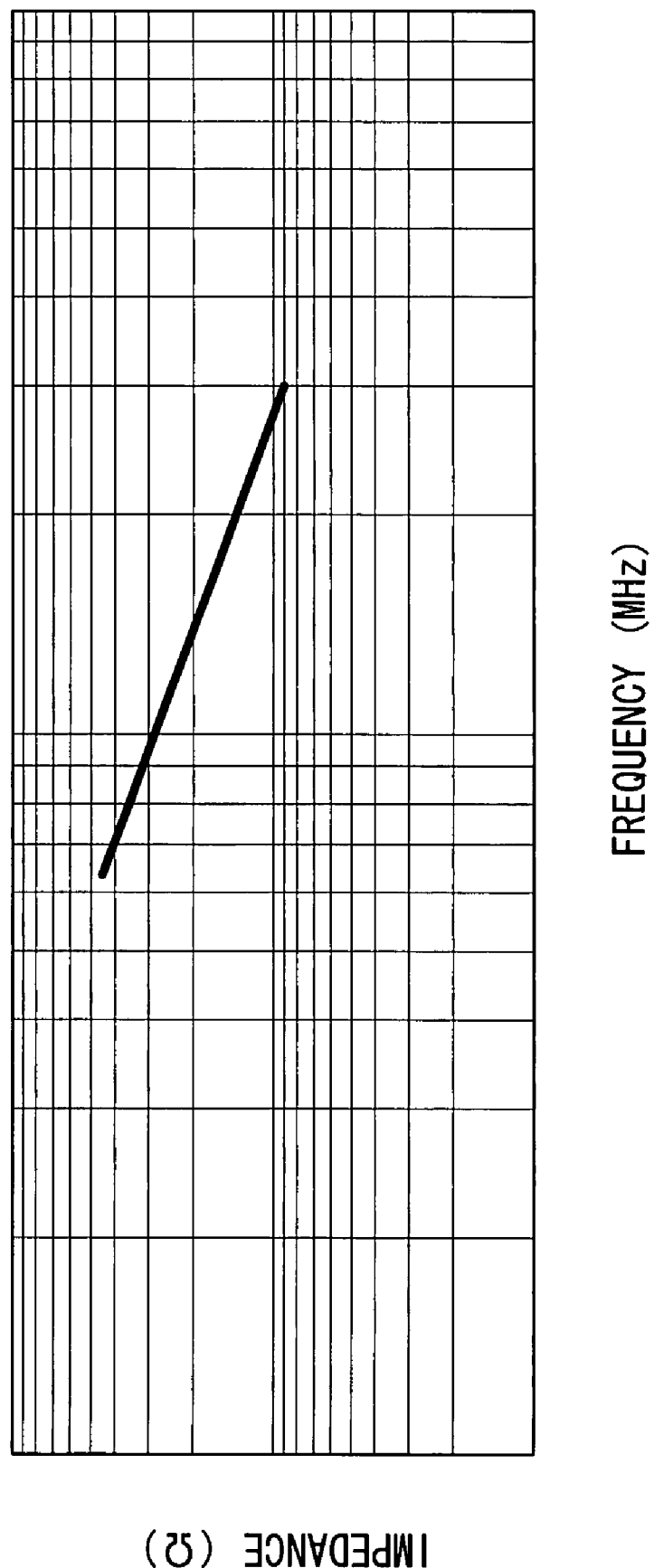
FIG. 6 is a graph showing another example of frequency characteristics of capacitors.

FIGS. 4 to 6 show examples of frequency characteristics of capacitors for connection to the grounding lands 12a and 12b and the ground-connection lands 13a and 13b shown in FIG. 2. In this embodiment, capacitors having the frequency characteristics shown in FIG. 4 are connected to the grounding lands 12a and 12b and the ground-connection lands 13a and 13b.

Alternatively, capacitors having the frequency characteristics shown in FIG. 5 or 6 may be used instead of the capacitors having the frequency characteristics shown in FIG. 4.

For example, capacitors having characteristics suitable for noise reduction in the frequency band of about 0.15 MHz to 2,500 MHz may be selected for car air conditioners, which often require noise reduction in this frequency band.

In the car air conditioner 1 according to this embodiment, as described above, the ground pattern of the low-voltage circuit of the control board 10 used in the control apparatus 2 can be grounded, so that the low-voltage circuit can operate at a stable frequency.

In addition, the ground patterns of the high-voltage and low-voltage circuits can be connected via the capacitors connected to the ground-connection lands 13a and/or the ground-connection lands 13b to reduce noise on the high-voltage circuit side. Also, the low-voltage circuit and the high-voltage circuit can be electrically separated because the ground patterns thereof are connected via the capacitors.

Furthermore, the ground pattern of the high-voltage circuit can be grounded via the capacitors connected to the grounding lands 12a and/or the grounding lands 12b, so that the high-voltage circuit can operate at a stable frequency.

What is claimed is:

1. A control apparatus having a control board connected to separated low voltage and high voltage power sources, said control board comprising:
    a low-voltage pattern for a low-voltage circuit, said low-voltage pattern being connected to the low-voltage power source and being configured to control a low-voltage from the low-voltage power source, includes a first ground pattern connectable to a ground;
    a high-voltage pattern for a high-voltage circuit, said high-voltage pattern being connected to the high voltage power source and being configured to control a high-voltage from the high-voltage power source, includes a second ground pattern; and
    at least one ground-connection land configured to connect the first ground pattern and the second ground pattern via at least one capacitor.

2. The control apparatus according to claim 1, wherein said control board further comprises:
    a grounding land configured to connect the second ground pattern and the ground via at least one capacitor.

3. The control apparatus according to claim 1, wherein said at least one ground-connection land is disposed such that a plurality of capacitors are connected in parallel.

4. The control apparatus according to claim 1, wherein said at least one ground-connection land is disposed such that a plurality of capacitors are connected in series.

5. The control apparatus according to claim 1, wherein:
    a plurality of ground-connection lands are each disposed at a different position; and
    each capacitor connected to a corresponding one of said plurality of ground connection lands has frequency characteristics corresponding to a frequency band of noise to be reduced.

* * * * *

UNITED STATES PATENT AND TRADEMARK OFFICE
CERTIFICATE OF CORRECTION

| | |
|---|---|
| PATENT NO. | : 7,534,109 B2 |
| APPLICATION NO. | : 11/705414 |
| DATED | : May 19, 2009 |
| INVENTOR(S) | : Makoto Hattori et al. |

It is certified that error appears in the above-identified patent and that said Letters Patent is hereby corrected as shown below:

On the Cover Page

Following item (65), Prior Publication Data, please insert the following Section:

--(30)       Foreign Application Priority Data
    October 13, 2006 (JP) . . . . . . . . . . . . . . . . 2006-280010--

Signed and Sealed this

First Day of September, 2009

David J. Kappos
*Director of the United States Patent and Trademark Office*